United States Patent
Hsieh et al.

(10) Patent No.: US 12,402,441 B2
(45) Date of Patent: Aug. 26, 2025

(54) SEMICONDUCTOR DEVICE

(71) Applicant: EPISTAR CORPORATION, Hsinchu (TW)

(72) Inventors: Chang-Hua Hsieh, Hsinchu (TW);
Chia-Ming Liu, Hsinchu (TW);
Chi-Hsiang Yeh, Hsinchu (TW);
Shuo-Wei Chen, Hsinchu (TW);
Yen-Kai Yang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 622 days.

(21) Appl. No.: 17/871,103

(22) Filed: Jul. 22, 2022

(65) Prior Publication Data
US 2023/0023705 A1 Jan. 26, 2023

(30) Foreign Application Priority Data
Jul. 23, 2021 (TW) ................. 110127080

(51) Int. Cl.
*H10H 20/825* (2025.01)
*H10H 20/815* (2025.01)
(52) U.S. Cl.
CPC ....... *H10H 20/8252* (2025.01); *H10H 20/815* (2025.01)
(58) Field of Classification Search
CPC .......... H10H 20/8252; H10H 20/815
See application file for complete search history.

(56) References Cited

U.S. PATENT DOCUMENTS

| | | | |
|---|---|---|---|
| 2017/0229549 A1* | 8/2017 | Derluyn | H01L 21/0262 |
| 2018/0012757 A1* | 1/2018 | Charles | H01L 21/02381 |
| 2019/0051515 A1* | 2/2019 | Shikauchi | H10D 62/357 |
| 2019/0362967 A1* | 11/2019 | Zhao | H01L 21/02381 |
| 2021/0028603 A1* | 1/2021 | Lee | H01S 5/18361 |
| 2021/0336058 A1* | 10/2021 | Sie | H10D 62/8164 |

* cited by examiner

*Primary Examiner* — Mark W Tornow
(74) *Attorney, Agent, or Firm* — DITTHAVONG, STEINER, & MLOTKOWSKI (57) ABSTRACT

A semiconductor device, includes: a first conductive type semiconductor region including a first semiconductor structure, wherein the first semiconductor structure includes one or more pairs of stack, the one or more pairs of stack respectively includes a first layer and a second layer, the first layer includes $Al_xGa_{1-x}N$, the second layer includes $Al_yGa_{1-y}N$, wherein $0 \leq x < 1$, $0 < y < 1$, $x < y$, wherein one of the one or more pairs of stack includes an interface region located between the first layer and the second layer adjacent to the first layer; a second conductive type semiconductor region located on the first conductive type semiconductor region; and an active region located between the first conductive type semiconductor region and the second conductive type semiconductor region; wherein the first semiconductor structure includes a first dopant having a first doping concentration with a peak value at the interface region.

18 Claims, 4 Drawing Sheets

SEMICONDUCTOR DEVICE

CROSS-REFERENCE TO RELATED APPLICATIONS

This disclosure claims the right of priority of TW Application No. 110127080, filed on Jul. 23, 2021, and the content of which is hereby incorporated by reference in its entirety.

BACKGROUND

Technical Field

The present application relates to a semiconductor device, particularly to a semiconductor device comprising a first conductive type semiconductor region, and the first conductive type semiconductor region comprises a first layer having a multilayer structure.

Description of the Related Art

Solid semiconductor device, such as light-emitting diode (LED), has advantages of low power consumption, low heat-generation, long lifetime, earthquake-proof characteristics, compact size, high response speed and good optical-electrical characteristics, such as stable light-emitting wavelength. Therefore, light-emitting diode have been widely applied to household appliances, equipment indicator lights, photoelectric products, and so forth.

SUMMARY

A semiconductor device, comprises: a first conductive type semiconductor region comprising a first semiconductor structure, wherein the first semiconductor structure comprises one or more pairs of stack, the one or more pairs of stack respectively comprise a first layer and a second layer, the first layer comprises $Al_xa_{1-x}N$, the second layer comprises $Al_yGa_{1-y}N$, wherein 0≤x<1, 0<y<1, x<y, wherein one of the one or more pairs of stack comprise an interface region located between the first layer and the second layer adjacent to the first layer; a second conductive type semiconductor region located on the first conductive type semiconductor region; and an active region located between the first conductive type semiconductor region and the second conductive type semiconductor region; wherein the first semiconductor structure comprises a first dopant having a first doping concentration with a peak value at the interface region.

DETAILED DESCRIPTION OF THE EMBODIMENTS

The embodiments of the present application are illustrated in details and are plotted in the drawings. The same or the similar portions in each of the drawings and the specification have the same reference numeral. A few embodiments of the present application may be understood with reference to the drawings. The drawings of the embodiments of the present application are also considered as a portion of detailed description of the embodiments of the present application. It is needed to understand that the drawings of the embodiments of the present application are not illustrated on the scale of actual apparatus and devices. In the drawings, the shape and thickness of an embodiment might be enlarged in order to clearly indicate the features of the embodiments of the present application. In addition, the structures and the apparatus in the drawings are schematically illustrated in order to clearly indicate the features of the embodiments of the present application.

In the present disclosure, if not otherwise specified, the general formula AlGaN represents $Al_aGa_{1-a}N$, wherein 0≤a≤1; the general formula InGaN represents $In_bGa_{1-b}N$, wherein 0≤b≤1; the general formula InAlGaN represents $In_cAl_dGa_{1-c-d}N$, wherein 0≤c≤1 and 0≤d≤1. The content of elements may be adjusted to achieve different purposes, such as adjusting an energy level or the dominant light-emitting wavelength of a light-emitting device when the semiconductor device comprises a light-emitting device.

In the following embodiments, terms used for indicating directions such as "upper," "lower," "front," "rear," "left" and "right," merely indicate the directions in the appended drawings. Therefore, directional terms are used for illustration and not for limiting the scope of the present disclosure.

The compositions of each of the layers and the dopants included in the semiconductor device of the present disclosure may be analyzed in any suitable way, such as secondary ion mass spectrometer (SIMS).

The thicknesses of each of the layers included in the semiconductor device of the present disclosure may be analyzed in any suitable way, such as transmission electron microscopy (TEM) or scanning electron microscope (SEM), in order to be in accord with such as depth positions of each of the layers in SIMS spectrum.

In accordance with any one of the embodiments of the present disclosure, the semiconductor device 1 comprises a light-emitting diode or a laser diode.

Figure 1:
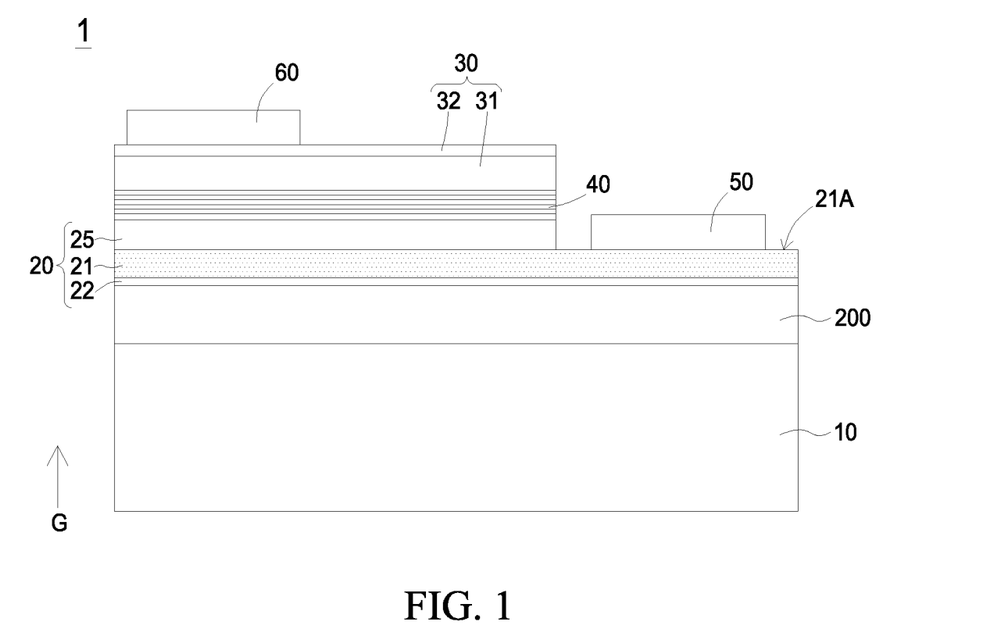
FIG. 1 shows a cross-sectional view of a semiconductor device in accordance with an embodiment of the present disclosure.

FIG. 1 is a cross-sectional view of a semiconductor device 1 in accordance with an embodiment of the present disclosure. In the present embodiment, the semiconductor device 1 comprises a substrate 10, a buffer structure 200 located on the substrate 10, a first conductive type semiconductor region 20 located on the buffer structure 200, a second conductive type semiconductor region 30 located on the first conductive type semiconductor region 20, and an active region 40 located between the first conductive type semiconductor region 20 and the second conductive type semiconductor region 30. The semiconductor device 1 further comprises a first electrode 50 and a second electrode 60. The first electrode 50 is located on the first conductive type semiconductor region 20 and is electrically connected with the first conductive type semiconductor region 20. The second electrode 60 is located on the second conductive type semiconductor region 30 and is electrically connected with the second conductive type semiconductor region 30. In an embodiment, the first conductive type semiconductor region 20 comprises a first semiconductor structure 21 and a second semiconductor structure 22, and the second semiconductor structure 22 is located below the first semiconductor structure 21.

Figure 2:
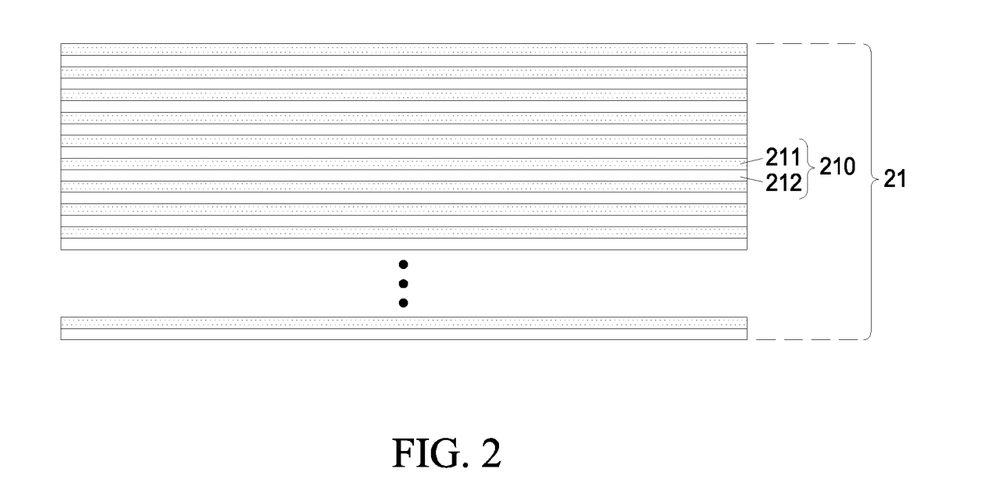
FIG. 2 shows a detailed structural drawing of a first semiconductor structure in accordance with an embodiment of the present disclosure.

FIG. 2 is a detailed structural drawing of a first semiconductor structure 21 in accordance with an embodiment of the present disclosure. The first semiconductor structure 21 comprises one or more pairs of stack 210. The pair of the stack 210 comprises a first layer 211 and a second layer 212. In some embodiments, the materials of the first layer 211 and the second layer 212 comprise III-V group semiconductor materials, such as III group nitride materials. In some embodiments, the material of the first layer 211 comprises $Al_xGa_{1-x}N$, wherein $0 \leq x \leq 1$; preferably $0 \leq x < 0.1$; preferably $0 \leq x < 0.05$; preferably $0 \leq x < 0.005$; more preferably x being substantially 0. In some embodiments, the material of the second layer 212 comprises $Al_yGa_{1-y}N$, wherein $0 < y < 1$; preferably $0 < y \leq 0.1$; more preferably $0 < y \leq 0.05$. In some embodiments, $y > x$, such as the material of the first layer 211 is gallium nitride and the material of the second layer 212 is aluminum gallium nitride. In some embodiment, the materials of the first layer 211 and the second layer 212 may also be doped with other III group elements, such as doping indium (In) in gallium nitride or in aluminum gallium nitride.

In some embodiments, the energy level of the second layer 212 is higher than the energy level of the first layer 211. In some embodiments, for example, the first layer 211 of gallium nitride material and the second layer 212 of aluminum gallium nitride are selected, and the second layer 212 of aluminum gallium nitride has an energy level higher than the energy level of the first level 211 of gallium nitride material. In some embodiments, the resistance of the second layer 212 is higher than the resistance of the first layer 211. To be more specific, the resistance of the second layer 212 of aluminum gallium nitride is higher than the resistance of the first layer 211 of gallium nitride material. Due to the higher resistance of the second layer 212 of aluminum gallium nitride, the current injected in the first layer 211 has better lateral current spreading so the anti-electrostatic discharge damage capacity and the luminous efficiency of the semiconductor device 1 can be increased.

The first layer 211 has a first thickness and the second layer 212 has a second thickness. The first thickness of the first layer 211, the second thickness of the second layer 212, and the number of pairs of the stack 210 may be adjusted according to the parameters like compositions, dopants, or thicknesses of the epitaxial layers adjacent to the stack 210, in order to achieve the function of current spreading. In addition, by adjusting the first layer 211 and the second layer 212, the stress generated by epitaxial growth may also be reduced so the epitaxial quality is improved. In some embodiments, the semiconductor device 1 has a better anti-electrostatic discharge capacity when the first layer 211 has a specific thickness and/or the second layer 212 has a specific thickness, for example, the first thickness is not greater than 100 nm and/or the second thickness is not greater than 100 nm. If the first thickness is too thick and/or the second thickness is too thick, for example, greater than 100 nm, the anti-electrostatic discharge capacity of the semiconductor device 1 becomes inferior. In some embodiments, the first thickness and/or the second thickness are between 5 nm and 100 nm. Preferably, the first thickness and/or the second thickness are between 10 nm and 80 nm (including end values). More preferably, the first thickness and/or the second thickness are between 20 nm and 70 nm (including end values).

In some embodiments, the number of pairs of the stack 210 in the first semiconductor structure 21 is between 5 pairs and 100 pairs, such as between 7 pairs and 40 pairs. In some embodiments, the total thickness of one or more pairs of stack 210 in the first semiconductor structure 21 is between 500 nm and 2500 nm (including end values), such as 1500 nm and 2000 nm (including end values). In some embodiments, in the case of the thickness of the first semiconductor structure 21 (the total thickness of pairs of the stack 210) being unchanged, the thinner the first thickness of the first layer 211, and/or the thinner the second thickness of the second layer 212 is, the more pairs of the stack 210 are in the first semiconductor structure 21, and the anti-electrostatic discharge capacity of the semiconductor device 1 is therefore increased. In some embodiments, the second thickness of the second layer 212 is approximately identical to or not identical to the first thickness of the first layer 211. In an embodiment, when growing the stack 210, if there is stress caused by growing the second semiconductor structure 22 and the buffer structure 200, the stress can be offset by having the first thickness of the first layer 211 different from the second thickness of the second layer 212. In another embodiment, when growing the stack 210, if no significant stress is generated after the growth of the second semiconductor structure 22 and the buffer structure 200, the second thickness of the second layer 212 is approximately identical to the first thickness of the first layer 211, for example, the difference between the first thickness and the second thickness is not greater than 1%. If the difference between the second thickness of the second layer 212 and the first thickness of the first layer 211 is greater than 1%, the stress in the stack 210 is increased and the epitaxial quality is affected.

Figure 3:
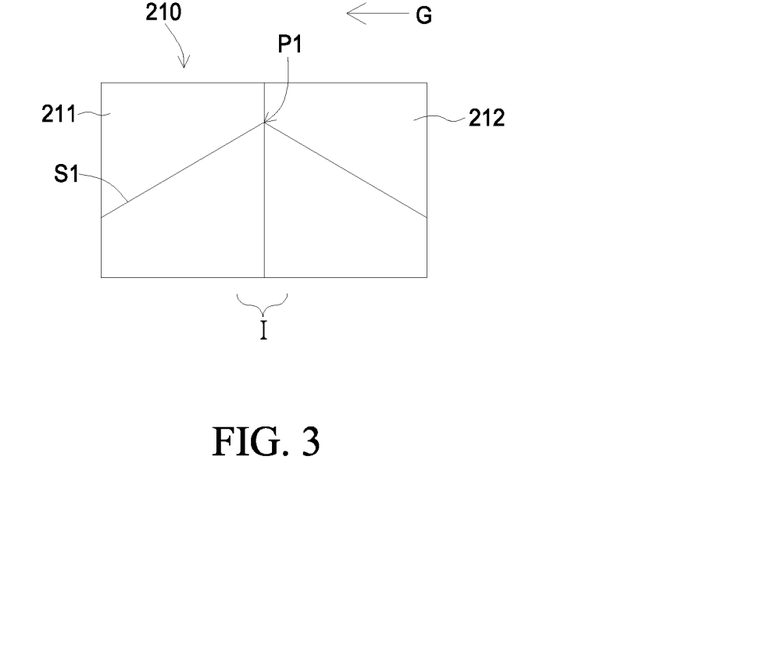
FIG. 3 shows a schematic view of a first doping concentration in one pair of a stack of a first semiconductor structure in accordance with an embodiment of the present disclosure.
Figure 4:
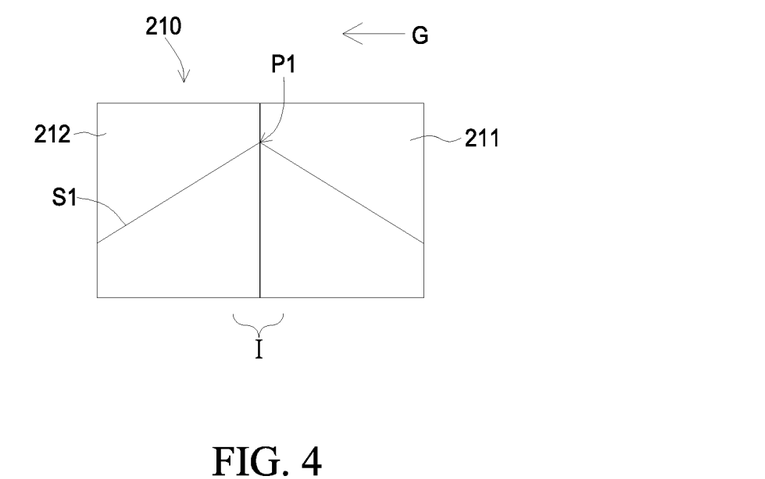
FIG. 4 shows a schematic view of a first doping concentration in one pair of a stack of a first semiconductor structure in accordance with another embodiment of the present disclosure.

FIG. 3 is a distribution diagram of a first doping concentration S1 in one pair of the stack 210 of a first semiconductor structure 21 in accordance with an embodiment of the present disclosure. FIG. 4 is a distribution diagram of a first doping concentration S1 in one pair of the stack 210 of a first semiconductor structure 21 in accordance with another embodiment of the present disclosure. In some embodiments, the first conductive type semiconductor region 20 comprises a first dopant. The first dopant comprises a first electrical conductivity type dopant. The first electrical conductivity type dopant comprises silicon (S1), but not limited thereto. The first dopant has a first doping concentration S1 in the first semiconductor structure 21. In some embodiments, similarly, other pairs of the stack 210 of the first semiconductor structure 21 also have a first dopant therein, and the first dopant in the first semiconductor structure 21 has a first doping concentration S1.

In some embodiments, as shown in FIG. 3, in the process of epitaxial growth of the first semiconductor structure 21, along the epitaxial growth direction G, the second layer 212 is grown in advance, and then the first layer 211 is grown in order to form a pair of the stack 210. An interface region I is located between the first layer 211 and the second layer 212. As shown in FIG. 2, the second layer 212 and the first layer 211 may be additionally grown repeatedly and alternately based on the needs to form multiple pairs of the stack 210. In each pair or several pairs of the stack 210 of the first semiconductor structure 21, the first layer 211 is located above the second layer 212. In some embodiments, the pairs of the stack 210 may be continuously grown or discontinuously grown by inserting a semiconductor layer between any two adjacent stacks 210 or between each of the adjacent stacks 210, for example.

In some embodiments, as shown in FIG. 4, along the epitaxial growth direction G, in the process of epitaxial growth of the first semiconductor structure 21, the first layer 211 is grown in advance, and then the second layer 212 is grown in order to form a pair of the stack 210. An interface region I is located between the first layer 211 and the second layer 212. In some embodiments, the first layer 211 and the second layer 212 may be grown repeatedly and alternately based on the needs, so as to form pairs of the stack 210. In each pair or multiple pairs of the stack 210 of the first semiconductor structure 21, the second layer 212 is located above the first layer 211. In some embodiments, the pairs of the stack 210 may be continuously grown or discontinuously grown by inserting a semiconductor layer between any two adjacent stacks 210 or between each of the adjacent stacks 210, for example.

In other embodiments (not shown in the drawings), a portion of the pairs of the stack 210 of the first semiconductor structure 21 is formed by growing the first layer 211 in advance and then growing the second layer 212 repeatedly and alternately, and another portion of the pairs of the stack 210 of the first semiconductor structure 21 is formed by growing the second layer 212 in advance and then growing the first layer 211 repeatedly and alternately. The two portions of the stack 210 may be adjacent to each other, or another semiconductor layer is inserted therebetween. The sequence of the two portions in the pairs of the stack 210 of the first semiconductor structure 21 is not limited.

As shown in FIGS. 3 and 4, an interface region I is located between the first layer 211 and the second layer 212 in each pair or multiple pairs of the stack 210 in the first semiconductor structure 21. In an embodiment, the interface region I comprises one-third of the thickness region of the second layer 212 and/or the first layer 211 extended outward from two sides of the junction of the second layer 212 and the first layer 211. In some embodiments, the first doping concentration 51 in the first layer 211 and/or the second layer 212 gradually changes toward the interface region I from one side away from the interface region I. For example, as shown in FIG. 3, the first doping concentration 51 in the second layer 212 gradually increases toward the interface region I from one side away from the interface region I and close to the substrate 10; the first doping concentration 51 in the first layer 211 gradually increases toward the interface region I from one side away from the interface region I and close to the active region 40, namely, gradually decreasing toward one side of the active region 40 from one side close to the interface region I. In an embodiment, the first doping concentration S1 in the stack 210 has a peak value P1, and the peak value P1 is in the interface region I. Similarly, as shown in FIG. 4, the first doping concentration S1 in the first layer 211 gradually increases toward the interface region I from one side away from the interface region I and close to the substrate 10; the first doping concentration S1 in the second layer 212 gradually increases toward the interface region I from one side away from the interface region I and close to the active region 40, namely, gradually decreasing toward one side of the active region 40 from one side close to the interface region I. To be more specific, as shown in FIG. 3, in some embodiments, when the second layer 212 is epitaxially grown, a first dopant therein is introduced and the first doping concentration S1 gradually increases along the epitaxial growth direction G and the growth direction of the second layer 212. Then, when the first layer 211 is epitaxially grown, the first doping concentration S1 gradually decreases along the epitaxial growth direction G and the growth direction of the first layer 211. The growth sequences of the first layer 211 and the second layer 212 in FIGS. 3 and 4 are opposite. The first doping concentration S1 gradually increases toward the interface region I along the epitaxial growth direction G and the growth direction of the first layer 211; the first doping concentration S1 gradually decreases along the epitaxial growth direction G and the growth direction of the second layer 212 from the interface region I. In some embodiments, as shown in FIG. 3, when the first layer 211 and the second layer 212 are epitaxially grown, the precursors compositions of the first layer 211 and the second layer 212 are fixed, and the compositions of each of the layers do not gradually change along the epitaxial growth direction G. The precursor amount of the first dopant gradually increases along the epitaxial growth direction G and the growth direction of the second layer 212, the precursor amount of the first dopant gradually decreases along the growth direction of the first layer 211, and there is a peak value P1 formed in the interface region I. In some embodiments, as shown in FIG. 4, when the first layer 211 and the second layer 212 are epitaxially grown, the precursor compositions of the first layer 211 and the second layer 212 are fixed, and the compositions of each of the layers do not gradually change along the epitaxial growth direction G (the direction of thickness increase). The precursor amount of the first dopant gradually increases along the epitaxial growth direction G and the growth direction of the first layer 211, the precursor amount of the first dopant gradually decreases along the growth direction of the second layer 212, and the peak value P1 is formed in the interface region I. In some embodiments, as shown in FIG. 3, when the second layer 212 is epitaxially grown, the amount of III group elements, such as aluminum (Al) element, in the composition of the second layer 212 gradually decreases along the epitaxial growth direction G and the growth direction of the second layer 212, and the amount of aluminum element of the first layer 211 gradually increases along the epitaxial growth direction G and the growth direction of the first layer 211. The precursor amount of the first dopant is fixed and does not change along the epitaxial growth direction G or along the growth direction of the first layer 211 and the second layer 212. Since the actual first doping concentrations 51 in the first layer 211 and the second layer 212 inversely vary corresponding to the change tendency of the compositions or concentrations of aluminum element in the first layer 211 and the second layer 212, there is a peak value P1 formed in the interface region I. For instance, when the compositions or concentrations of aluminum element in the first layer 211 and the second layer 212 gradually increase, the first doping concentrations S1 gradually decrease. For instance, when the compositions or concentrations of aluminum element in the first layer 211 and the second layer 212 gradually decrease, the first doping concentrations S1 gradually increase. Similarly, as shown in the embodiment of FIG. 4, the first layer 211 is grown in advance and then the second layer 212 is grown, the precursor amount of III group elements, such as aluminum element, in the composition of the first layer 211 gradually decreases along the epitaxial growth direction G and the direction of thickness increase of the first layer 211, and the precursor amount of aluminum element of the second layer 212 gradually increases along the epitaxial growth direction G and the growth direction of the second layer 212. The precursor amount of the first dopant is fixed and does not change along the epitaxial growth direction G or the growth direction of the first layer 211 and the second layer 212. The actual first doping concentration S1 gradually increases in the first layer 211 and gradually decreases in the second layer 212, and thus the peak value P1 is formed in the interface region I.

In some embodiments, the peak value P1 of the first doping concentration S1 is formed outside the interface region I (not shown in the drawings), for example, in the first layer 211 or in the second layer 212. In an embodiment, when the second layer 212 and the first layer 211 are epitaxially grown sequentially, the precursor compositions of the second layer 212 and the first layer 211 are fixed, and the compositions of each of the layers does not gradually change along the epitaxial growth direction G (the direction of thickness increase). The precursor amount of the first dopant gradually increases along the epitaxial growth direction G and the growth direction of the second layer 212, the precursor amount of the first dopant gradually decreases along the growth direction of the first layer 211, and then the peak value P1 is formed outside the interface region I and inside the region of the second layer 212 or the first layer 211. In an embodiment, when the first layer 211 and the second layer 212 are epitaxially grown sequentially, the precursors compositions of the first layer 211 and second layer 212 are fixed, and the compositions of each of the layers does not gradually change along the epitaxial growth direction G (the direction of thickness increase). In another embodiment, the precursor amount of the first dopant gradually increases along the epitaxial growth direction G and the growth direction of the first layer 211, the precursor amount of the first dopant gradually decreases along the growth direction of the second layer 212, and then the peak value P1 is formed outside the interface region I and inside the region of the first layer 211 or the second layer 212. In some embodiments, when the second layer 212 and the first layer 211 are epitaxially grown sequentially, the precursor amount of III group elements, such as aluminum element, gradually decreases along the epitaxial growth direction G and the growth direction of the second layer 212, gradually increases along the epitaxial growth direction G and the growth direction of the first layer 211, and the precursor amount of the first dopant is fixed and does not change along the epitaxial growth direction G or along the growth direction of the first layer 211 and the second layer 212. Since the actual first doping concentrations S1 in the first layer 211 and the second layer 212 inversely vary corresponding to the change tendency of the compositions or concentrations of aluminum element in the first layer 211 and the second layer 212, the peak value P1 is formed outside the interface region I and inside the region of the first layer 211 or the region of the second layer 212. For example, the compositions or concentrations of aluminum element in the first layer 211 and the second layer 212 gradually increase, and the first doping concentrations S1 gradually decrease. Similarly, when the first layer 211 is grown in advance and then the second layer 212 is grown, the precursor amount of aluminum element of the first layer 211 gradually decreases along the epitaxial growth direction G and the growth direction of the first layer 211, and the precursor amount of aluminum element of the second layer 212 gradually increases along the epitaxial growth direction G and the growth direction of the second layer 212. When the precursor amount of the first dopant is fixed and does not change along the epitaxial growth direction G or along the direction of thickness increase of the first layer 211 and the second layer 212, the first doping concentration S1 gradually increases in advance and then gradually decreases along the epitaxial growth direction G, and the peak value P1 is formed outside the interface region I and inside the region of the first layer 211 or the region of the second layer 212. In an embodiment, when the first layer 211 and the second layer 212 are epitaxially grown, the precursor compositions of the first layer 211 and the second layer 212 are fixed, and the compositions of each of the layers do not gradually change along the epitaxial growth direction G. In the case of the fixed precursor amount of the first dopant, since the content of III group elements, such as aluminum element, in the materials of the first layer 211 and the second layer 212 are different, the first doping concentrations S1 of the first layer 211 and the second layer 212 are correspondingly different. For example, the composition or concentration of aluminum element in the first layer 211 is lower than the composition or concentration of aluminum element in the second layer 212, and the peak value P1 of the first doping concentration S1 is formed outside the interface region I and inside the region of the first layer 211. Similarly, when the composition or concentration of aluminum element in the second layer 212 is lower than the composition or concentration of aluminum element in the first layer 211, and the peak value P1 of the first doping concentration S1 is formed outside the interface region I and inside the region of the second layer 212.

In some embodiments, as shown in FIG. 3, the way of gradual change of the first doping concentrations S1 in the second layer 212 and/or in the first layer 211 can be linear or non-linear gradual change, but not limited thereto. Linear gradual change or non-linear gradual change include continuous gradual change or discontinuous gradual change, respectively. In some embodiments, the first doping concentration S1 indicates linear and discontinuous gradual change, for example, staircase gradual change (not shown in the drawings), toward the interface region I from one side away from the interface region I. The ways of gradual change of the first doping concentrations S1 in the second layer 212 and the first layer 211 may be identical or different.

Referring to FIG. 1, in some embodiments, the first conductive type semiconductor region 20 comprises a second semiconductor structure 22 located between the first semiconductor structure 21 and the buffer structure 200. In some embodiments, the second semiconductor structure 22 has the function of modulation and may perform modulation function between the first semiconductor structure 21 and the buffer structure 200, and the first conductive type semiconductor region 20 may be adjusted depending on the first semiconductor structure 21 and the buffer structure 200. For example, the materials difference between the first semiconductor structure 21 and the buffer structure 200 may cause lattice mismatch or stress between material layers, or the difference of growth temperatures of the first semiconductor structure 21 and the buffer structure 200 may cause wafer warpage. With the modulation of materials, the modulation of dopants, the modulation of structures or the modulation of epitaxial conditions of the second semiconductor structure 22, the negative effects generated by the differences between the first semiconductor structure 21 and the buffer structure 200 are decreased. With the second semiconductor structure 22, defects of epitaxy caused by temperature or pressure may be reduced so the epitaxial quality is enhanced. With the enhanced epitaxial quality, leakage current (Ir) of the semiconductor device 1 is improved and the anti-electrostatic discharge capacity of the semiconductor device 1 is enhanced. In some embodiments, the second semiconductor structure 22 comprises InAlGaN series materials. In some embodiments, the second semiconductor structure 22 comprises $Al_{z1}In_{z2}Ga_{1-z1-z2}N$, wherein $0 \leq z2 \leq z1 \leq 1$. In some embodiments, the second semiconductor structure 22 comprises AlzGai-zN, wherein $0 \leq z \leq 1$. In some embodiments, $0 \leq z \leq 0.1$. In some embodiments, $0 \leq z \leq 0.05$. In some embodiments, if z is not greater than 0, defects of the epitaxy structure cannot be inhibited by the second semiconductor structure 22, and the luminous efficiency of the semiconductor device 1 is reduced.

The second semiconductor structure 22 may be doped or undoped (namely, unintendedly doped). In some embodiments, the second semiconductor structure 22 comprises a first dopant, and the first dopant has a second doping concentration. In some embodiments, the second doping concentration is lower than the first doping concentration S1. In some embodiments, the second doping concentration is not greater than $3 \times 10^{19}/cm^3$. In some embodiments, the second doping concentration of the second semiconductor structure 22 is between $1 \times 10^{18}/cm^3$ and $2 \times 10^{19}/cm^3$. In some embodiments, the second semiconductor structure 22 is undoped. By forming a two-dimensional electron gas (2DEG) between the undoped second semiconductor structure 22 and the buffer structure 200 below thereof, current spreading effects of the device is further enhanced. With the second semiconductor structure 22 on the buffer structure 200, the quality of the first semiconductor structure 21 may be optimized. For example, the number of pairs of the stack 210 of the first semiconductor structure 21 is declined or the thickness of the first semiconductor structure 21 is decreased, in order to reduce the time of epitaxial growth and increase luminance.

The second semiconductor structure 22 has a third thickness. In some embodiments, the third thickness affects the luminance of the semiconductor device 1. When the second semiconductor structure 22 has a specific thickness, for example, the third thickness is not greater than 50 nm, the semiconductor device 1 has better luminance. If the third thickness is too thick, for example, the third thickness is greater than 50 nm, the semiconductor device 1 has lower luminance. The thinner the third thickness is, the higher the luminance of the semiconductor device 1 can achieve. In some embodiments, the third thickness is less than 15 nm, 5 nm, or 3 nm. In some embodiments, the third thickness affects the anti-electrostatic discharge capability of the semiconductor device 1. If the third thickness is too thin, for example, the third thickness is less than 0.1 nm, the anti-electrostatic discharge capability of the semiconductor device 1 becomes inferior. In some embodiments, the third thickness is not less than 0.1 nm. In some embodiments, in order to increase luminance and anti-electrostatic discharge capability simultaneously, the third thickness is between 0.5 nm and 15 nm (including end values), more preferably, between 1 nm and 5 nm (including end values).

In an embodiment, the first semiconductor structure 21 is in direct contact with the second semiconductor structure 22, namely, no other layer being between the first semiconductor structure 21 and the second semiconductor structure 22. As shown in FIG. 3, the second layer 212 of the first semiconductor structure 21 is in contact with the second semiconductor structure 22 in the stack 210 of the first semiconductor structure 21. Alternatively, the stack 210 of the first semiconductor structure 21 is as shown in FIG. 4, the first layer 211 of the first semiconductor structure 21 is in contact with the second semiconductor structure 22.

Referring to FIG. 1, in some embodiments, the first conductive type semiconductor region 20 further comprises a fifth semiconductor structure 25, and the fifth semiconductor structure 25 is located between the first semiconductor structure 21 and the active region 40. In some embodiments, the fifth semiconductor structure 25 comprises a single-layer structure or a multi-layer structure. The material of the fifth semiconductor structure 25 comprises $Al_uIn_vGa_{1-u-v}N$, wherein $0 \leq u \leq 0.5$, $0 \leq v \leq 0.5$, in some embodiments, $0 \leq u \leq 0.1$, $0 \leq v \leq 0.15$. In some embodiments, the fifth semiconductor structure 25 comprise a third layer, wherein u and v in the composition of the material are substantially 0. In some embodiments, the material of the third layer comprises GaN. In some embodiments, the third layer comprises a first dopant. To further lower the forward voltage and improve the anti-electrostatic discharge capability of the semiconductor device 3, the doping concentration of the first dopant in the third layer is less than the first doping concentration S1 in the first semiconductor structure 21. For example, the doping concentration of the first dopant in the third layer is one order of magnitude less than the first doping concentration S1. In an embodiment, the doping concentration of the first dopant in the third layer is not less than $1 \times 10^{17}/cm^3$, preferably, not greater than $5 \times 10^{18}/cm^3$. In some embodiments, the third layer has a thickness not less than 50 nm and/or not greater than 1000 nm; preferably, between 100 nm and 500 nm (including end values); more preferably, between 150 nm and 350 nm (including end values). If the thickness of the third layer is less than 50 nm, the anti-electrostatic discharge capability of the semiconductor device 1 becomes inferior, and the forward voltage of the semiconductor device 1 becomes higher.

In some embodiments, the first conductive type semiconductor region 20 further comprises a sixth semiconductor structure (not shown in the drawings) located between the active region 40 and the fifth semiconductor structure 25. The sixth semiconductor structure comprises a first intermediate layer (not shown in the drawings) and/or a second intermediate layer (not shown in the drawings) located on the first intermediate layer. In an embodiment, the materials of the first intermediate layer and the second intermediate layer are substantially identical. In the present embodiment, the materials of the first intermediate layer and the second intermediate layer comprise InAlGaN; preferably, the content of indium of the first intermediate layer is not greater than the content of indium of the second intermediate layer. In an embodiment, the first intermediate layer and/or the second intermediate layer is doped or undoped (namely, unintendedly doped). The first intermediate layer comprises a first dopant having a doping concentration, the second intermediate layer comprises another first dopant having a doping concentration, and the doping concentration of the first dopant of the first intermediate layer is less than the doping concentration of the other first dopant of the second intermediate layer. In the present embodiment, the first dopants of the first intermediate layer and the second intermediate layer are identical and comprise silicon. The concentration of the first dopant of the first intermediate layer is not less than $1 \times 10^{17}/cm^3$, preferably, not greater than $1 \times 10^{18}/cm^3$. The concentration of the first dopant of the second intermediate layer is not less than $5 \times 10^{17}/cm^3$, preferably, not greater than $5 \times 10^{18}/cm^3$.

In some embodiments, the sixth semiconductor structure comprises a semiconductor lamination structure (not shown in the drawings) located between the active region 40 and the fifth semiconductor structure 25, or located between the second intermediate layer and the active region 40. The semiconductor lamination structure comprises first semiconductor layers (not shown in the drawings) and second semiconductor layers (not shown in the drawings) alternately arranged, wherein a first semiconductor layer and a second semiconductor layer, which are adjacent to each other, are considered as a pair. In an embodiment, the first semiconductor layers and/or the second semiconductor layers are doped or undoped (namely, unintendedly doped). A first semiconductor layer and a second semiconductor layer comprise III-V group semiconductor materials, such as InAlGaN series materials. The energy level of the first semiconductor layer in a pair is higher than the energy level of the second semiconductor layer in the pair. The first semiconductor layer comprises, such as $Al_m In_n Ga_{1-m-n}N$, wherein $0 \leq m \leq 1$, $0 \leq n \leq 1$, and the second semiconductor layer comprises $Al_p In_q Ga_{1-p-q}N$, wherein $0 \leq p \leq 1$, $0 \leq q \leq 1$, and wherein m>p, n<q. In an embodiment, the first semiconductor layer comprises GaN or AlGaN, and the second semiconductor layer comprises InGaN. In an embodiment, the first semiconductor layer comprises GaN or AlGaN and is doped with the first dopant, and the second semiconductor layer comprises doped or undoped InGaN. In an embodiment, the first semiconductor layer comprises a first sub-layer (not shown in the drawings) and a second sub-layer (not shown in the drawings) located on the first sub-layer. The material of the first sub-layer comprises $Al_{n1} Ga_{1-n1}N$, wherein $0 \leq n1 < 1$. The material of the second sub-layer comprises $Al_{n2} Ga_{1-n2}N$, wherein $0 \leq n2 < 1$. In an embodiment, the materials of the first sub-layer and the second sub-layer are substantially identical, such as GaN. In am embodiment, the first sub-layer and/or the second sub-layer are doped or undoped (namely, unintendedly doped). In an embodiment, the first sub-layer is doped, and the second sub-layer is undoped. In an embodiment, the first sub-layer and the second sub-layer respectively comprise a dopant, the concentration of the dopant in the second sub-layer is greater than the concentration of the dopant in the first sub-layer. In another embodiment, a third sub-layer between the first sub-layer and the second sub-layer may be further disposed, and the material of the third sub-layer comprises $Al_{n3} Ga_{1-n3}N$, wherein $0 \leq n3 < 1$. In the present embodiment, the material of the third sub-layer is doped or undoped (namely, unintendedly doped), preferably, the third sub-layer is undoped. In an embodiment, each of the second semiconductor layers comprises one of III group elements, and the contents of III group elements of the second semiconductor layers close to the active region 40 are higher than the contents of III group elements of the second semiconductor layers away from the active region 40. In the present embodiment, III group elements comprise indium. Since the semiconductor device 1 of the present embodiment comprises a sixth semiconductor structure, the luminous efficiency of the semiconductor device 1 may be further increased.

Referring to FIG. 1, in some embodiments, the first electrode 50 is located above the first conductive type semiconductor region 20. In some embodiments, by removing a portion of the second conductive type semiconductor region 30 and a portion of the active region 40 with an etching process, a surface 21A of a portion of the first semiconductor structure 21 is exposed and the first electrode 50 is in direct contact with the surface 21A of the first semiconductor structure 21. In some embodiments, in the etching process, a portion of the fifth semiconductor structure 25 of the first conductive type semiconductor region 20 and/or the first semiconductor structure 21 is further removed down to a depth. The surface 21A of a portion of the first semiconductor structure 21 is exposed and the surface 21A is not overlapped with the active region 40 in the epitaxial growth direction G. The first electrode 50 is in direct contact with the surface 21A of the first semiconductor structure 21. In an embodiment, the surface 21A of the first semiconductor structure 21 is the surface of the first layer 211 and the first electrode 50 is in direct contact with the surface of the first layer 211 of the first semiconductor structure 21. In another embodiment, the surface 21A of the first semiconductor structure 21 is the surface of the second layer 212 and the first electrode 50 is in direct contact with the surface of the second layer 212 of the first semiconductor structure 21.

Figure 5:
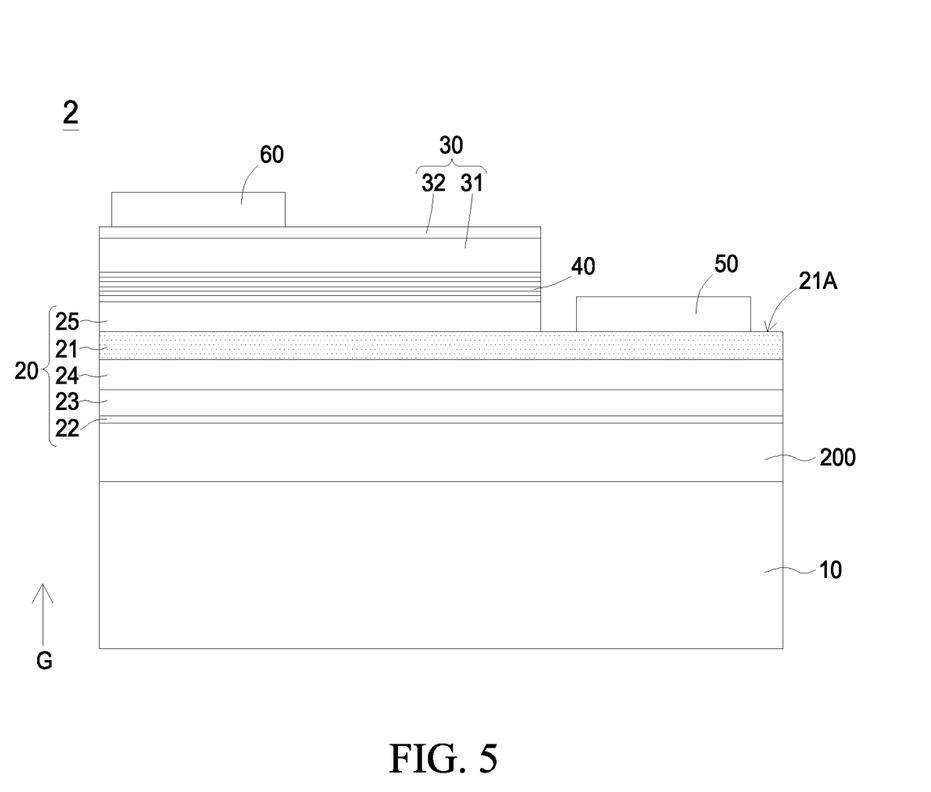
FIG. 5 shows a cross-sectional view of a semiconductor device in accordance with an embodiment of the present disclosure.
Figure 6:
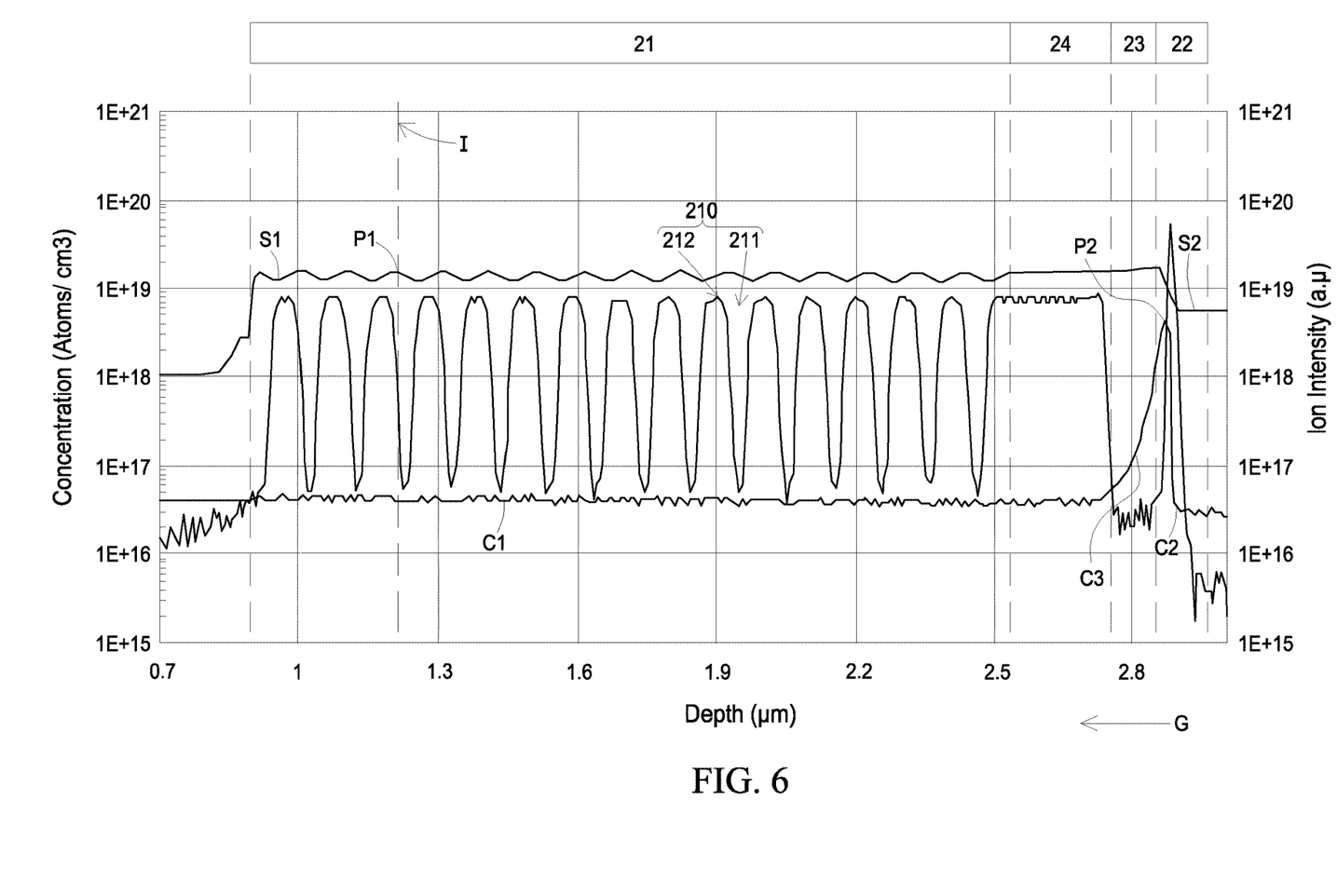
FIG. 6 shows a diagram of the element concentration and the ionic strength relating to depth of a partial epitaxial structure of a semiconductor device in accordance with an embodiment of the present disclosure.

FIG. 5 is a cross-sectional view of a semiconductor device 2 in accordance with another embodiment of the present disclosure. FIG. 6 is a diagram of the element concentration and the ionic strength relating to the depth of a partial epitaxial structure of the semiconductor device 2 in accordance with an embodiment of the present disclosure, and the diagram is obtained from the analysis of secondary ion mass spectrometer (SIMS). In FIG. 6, the horizontal axis coordinate shows the depth toward the direction of the substrate 10 from the surface of epitaxial structure of the semiconductor device, the left vertical axis coordinate shows the concentrations of each of the dopants in each of the layers of the epitaxial structure, and the right vertical axis coordinate shows the strength of the III group elements (corresponding to the relative amount of III group elements) contained in the III-V group materials of each of the layers. The structures of the semiconductor device 2 and the semiconductor device 1 are similar, and the difference is that, in the first conductive type semiconductor region 20, a third semiconductor structure 23 between the first semiconductor structure 21 and the second semiconductor structure 22 is further disposed, and a fourth semiconductor structure 24 between the first semiconductor structure 21 and the third semiconductor structure 23 is further disposed. In the following content, similar structure contents between the semiconductor device 2 and the semiconductor device 1 may be replaced or shared with each other. The differences between the semiconductor device 2 and the semiconductor device 1 will be described in detail in the following.

Referring to FIG. 5 and FIG. 6, in some embodiments, the second semiconductor structure 22 comprises a first dopant. In some embodiments, the first dopant in the second semiconductor structure 22 has a second doping concentration S2. In some embodiments, the second doping concentration S2 is less than the first doping concentration 51 of the first semiconductor structure 21. In some embodiments, the second doping concentration S2 is not greater than $3 \times 10^{19}/cm^3$. In some embodiments, the second doping concentration S2 of the second semiconductor structure 22 is between $1 \times 10^{18}/cm^3$ and $2 \times 10^{19}/cm^3$.

In some embodiments, the material of the third semiconductor structure 23 comprises $Al_w Ga_{1-w}N$, wherein $0 \leq w \leq 0.5$, in some embodiments, $0 \leq w \leq 0.05$, and in some embodiments, w can substantially equal to 0. In some embodiments, the material of the third semiconductor structure 23 comprises GaN.

In some embodiments, the third semiconductor structure 23 comprises a first dopant, and the doping concentration of the first dopant in the third semiconductor structure 23 is not less than the first doping concentration S1. In some embodiments, the first semiconductor structure 21, the second semiconductor structure 22, the third semiconductor structure 23 and the fourth semiconductor structure 24 comprise a second dopant, respectively. In some embodiments, the second dopant comprises carbon (C), hydrogen (H), oxygen (O), or the combination thereof. In an embodiment, the second dopant in the first semiconductor structure 21 has a third doping concentration C1, the second dopant in the second semiconductor structure 22 has a fourth doping concentration C2, and the second dopant in the third semiconductor structure 23 has a fifth doping concentration C3, wherein the fourth doping concentration C2 has a peak value P2, the peak value P2 is greater than the fifth doping concentration C3 and the third doping concentration C1, and/or the fifth doping concentration C3 is greater than the third doping concentration C1. In some embodiments, the third semiconductor structure 23 has a fourth thickness between 50 nm and 300 nm (including end values), for example, between 100 nm and 200 nm. In some embodiments, as shown in FIG. 5 and FIG. 6, the material of the fourth semiconductor structure 24 comprises $Al_vGa_{1-v}$, wherein $0 \leq v \leq 1$, in some embodiments, $0 \leq v \leq 0.5$, in some embodiments, $0 \leq v \leq 0.1$, and in some embodiments, $0 \leq v \leq 0.01$. In some embodiments, the content of aluminum in the materials of the fourth semiconductor structure 24 is not less than the content of aluminum of the first semiconductor structure 21, preferably, not less than the content of aluminum of the second layer 212 of one pair of the stack 210 of the first semiconductor structure 21. In some embodiments, the content of aluminum in the materials of the fourth semiconductor structure 24 is not greater than the content of aluminum of the second semiconductor structure 22. In some embodiments, the fourth semiconductor structure 24 comprises a first dopant, the doping concentration of the first dopant in the fourth semiconductor structure 24 is not less than the first doping concentration S1 and/or greater than the second doping concentration S2. In some embodiments, the fourth semiconductor structure 24 has a fifth thickness between 50 nm and 400 nm (including end values), for example, between 150 nm and 350 nm (including end values). With high fourth doping concentration C2 in the second semiconductor structure 22, epitaxial quality of the second semiconductor structure 22 becomes inferior, which has the effects of stress relief, so the better epitaxial quality of the third semiconductor structure 23 located on the second semiconductor structure 22 can be achieved after stress relief. With better epitaxial quality of the third semiconductor structure 23, the quality of each of the epitaxial layers thereon can be enhanced, and then the luminance of the semiconductor device 2 can be increased.

In some embodiments, interface regions I are between the first layers 211 and the second layers 212 of each of the pairs of the stack 210. The peak value P1 of the first doping concentration S1 in the stack 210 is formed inside the interface region I. The ratio of the maximum value (i.e. the peak value P1) to the minimum value of the first doping concentration S1 in the stack 210 is not greater than 10; preferably, not less than 1.1; preferably, between 1.2 and 5 (including end values). In some embodiments, the first doping concentration S1 is not less than $1 \times 10^{18}/cm^3$, or not greater than $1 \times 10^{20}/cm^3$; preferably, the first doping concentration S1 is between $5 \times 10^{18}/cm^3$ and $5 \times 10^{19}/cm^3$ (including end values); and preferably, the first doping concentration S1 is between $1 \times 10^{19}/cm^3$ and $2 \times 10^{19}/cm^3$ (including end values). If the first doping concentration S1 is greater than $1 \times 10^{20}/cm^3$, the epitaxial quality becomes inferior because of the excessive doping concentration, which makes the resistances of the first layer 211 and the second layer 212 higher, so the forward voltage of the semiconductor device 2 is increased and the anti-electrostatic discharge capability of the semiconductor device 2 is decreased. If the first doping concentration S1 is lower than $1 \times 10^{18}/cm^3$, the current dispersion of the semiconductor device 2 also becomes inferior, the forward voltage of the semiconductor device 2 is increased and the luminance efficiency of the semiconductor device 2 is decreased. The interface region I comprises a region of the junction of the first layer 211 and the second layer 212. In an embodiment, the interface region I comprises a region, which is one-third of the thickness of the second layer 212 and/or the first layer 211 from the two sides of the junction of the second layer 212 and the first layer 211.

In some embodiments, any one of III group elements in the materials of the first layer 211 and/or the second layer 212 is in the form of a dopant and exists in the composition of the materials. The doping concentration of III group elements of the first layer 211 is different from the doping concentration of III group elements of the second layer 212, and the doping concentrations of III group elements of the first layer 211 and/or the second layer 212 is less than $1 \times 10^{20}/cm^3$; preferably, between $1 \times 10^{19}/cm^3$ and $1 \times 10^{20}/cm^3$ (including end values). In some embodiments, the doping concentration of III group elements of the first layer 211 is less than the doping concentration of III group elements of the second layer 212. In an embodiment, when the dopant of one of the first layer 211 and the second layer 212 is one of III group elements, the other of the first layer 211 and the second layer 212 is substantially not doped with III group elements. In an embodiment, the materials of the first layer 211 and/or the second layer 212 is GaN or InGaN, and the III group element of the dopants of the first layer 211 and/or the second layer 212 is aluminum (Al). In an embodiment, the materials of the first layer 211 and/or the second layer 212 is GaN or AlGaN, and the III group element of the dopants of the first layer 211 and/or the second layer 212 is indium (In).

Referring to FIG. 6 again, the first semiconductor structure 21 and the second semiconductor structure 22 comprise a second dopant, respectively. In some embodiments, the third doping concentration C1 of the second dopant of the first semiconductor structure 21 is not greater than $1 \times 10^{17}/cm^3$, for example, less than $5 \times 10^{16}/cm^3$. In some embodiments, the fourth doping concentration C2 of the second dopant of the second semiconductor structure 22 is greater than $1 \times 10^{17}/cm^3$; preferably, not greater than $1 \times 10^{21}/cm^3$. In some embodiments, the fourth doping concentration C2 is between $1 \times 10^{19}/cm^3$ and $1 \times 10^{20}/cm^3$ (including end values). In some embodiments, if the second semiconductor structure 22 does not exist in the first conductive type semiconductor region 20, the anti-electrostatic discharge capability of the semiconductor device 2 is decreased.

In some embodiments, since the first doping concentration S1 of the first dopant in the first semiconductor structure 21 has a peak value P1 in the interface region I between the first layer 211 and the second layer 212, current dispersion effects on the first conductive type semiconductor region 20 may be enhanced. In addition, the fourth doping concentration C2 of the second dopant in the second semiconductor structure 22 is higher than the third doping concentration C1 of the second dopant in the first semiconductor structure 21, and the semiconductor device 2 has both of higher luminous efficiency and lower forward voltage. In some embodiments, which are similar to the embodiment of the semiconductor device 1, the second semiconductor structure 22 may modulate the differences between the first semiconductor structure 21 and the buffer structure 200. With the modulation of materials, the modulation of dopants, the modulation of structures or the modulation of epitaxial conditions of the second semiconductor structure 22, the differences between the first semiconductor structure 21 and the buffer structure 200 are reduced. For example, when the material composition of aluminum of the buffer structure 200 is higher and the material composition of aluminum of the first semiconductor structure 21 is lower, the percentage of aluminum of the second semiconductor structure 22 is adjusted between the percentages of aluminum of the buffer structure 200 and that of the first semiconductor structure 21 such that the stress between the buffer structure 200 and the first semiconductor structure 21 is adjusted and offset. For example, due to the temperature of epitaxy and the difference of substrate lattice, more epitaxial defects in the buffer structure 200 are caused. To avoid the epitaxial defects from extending into the first semiconductor structure 21, a second semiconductor structure 22 is inserted between the buffer structure 200 and the first semiconductor structure 21 to reduce stress, and the epitaxial defects extended toward the first semiconductor structure 21 are blocked. The second semiconductor structure 22 can reduce stress by adjusting sources of growth species of III group and V group, growing pressure, growing temperature or thickness of the second semiconductor structure 22, so the epitaxial quality is enhanced. With better epitaxial quality, the leakage current (Ir) of the semiconductor device 2 is improved, and the anti-electrostatic discharge capability of the semiconductor device 2 is increased.

In some embodiments, the second semiconductor structure 22 comprises InAlGaN series materials. In some embodiments, by adjusting a precursor ratio of V group to III group, changing epitaxial growth rate, or changing epitaxial growth temperature or growth pressure, the doping concentration of the second dopant of the second semiconductor structure 22 is adjusted. For example, by increasing the precursor ratio of V group to III group, reducing epitaxial growth rate, or lowering the growth temperature of the second semiconductor structure 22 such that the growth temperature of the second semiconductor structure 22 is lower than that of the buffer structure 200 or the first semiconductor structure 21, the second dopant of the second semiconductor structure 22 has higher fourth doping concentration C2. Accordingly, surface linear epitaxial defects of the semiconductor device 2 generated in epitaxial process are reduced and the epitaxial quality is enhanced.

In the present disclosure, the substrates 10 of the semiconductor device 1 and the semiconductor device 2 in accordance with any one of the embodiments have a sufficient thickness to support the layers and the structures located thereon, for example, not less than 30 and preferably, not greater than 300 µm. The substrate 10 comprises GaAs wafer used to epitaxially grow AlGaInP, or $Al_2O_3$ wafer, GaN wafer, SiC wafer or AlN wafer used to grow GaN, InGaN or AlGaN. Alternatively, the substrate 10 is a supporting substrate, comprising: conductive material such as silicon (Si), aluminum (Al), copper (Cu), tungsten (W), molybdenum (Mo), gold (Au), silver (Ag), silicon carbide (SiC) or alloy of abovementioned elements; thermally conductive material, such as diamond, graphite, ceramic material (e.g. AlN ceramic material or BeO ceramic material) or aluminum nitride; or transparent material, such as glass or sapphire. The growth substrate originally used to grow an epitaxial lamination may be optionally removed based on the application needs, and then the epitaxial lamination is transferred to the abovementioned supporting substrate. In an embodiment, a surface of the substrate 10 in contact with the epitaxial lamination has a roughened surface. The roughened surface may be a surface having an irregular form or a regular form. For example, the substrate 10 comprises one or more featured parts (not shown in the drawings) extruding or depressing on the top surface of the substrate 10. The shape of the featured part can be a hemisphere shape, a cone shape, or a multilateral cone shape. In other embodiments, the surface of the substrate 10 in contact with the epitaxial lamination is a flat surface.

In any one of the embodiments of the present disclosure, the method of epitaxial growth comprises metal-organic chemical vapor deposition (MOCVD), hydride vapor phase epitaxy (HVPE), molecular beam epitaxy (MBE), physical vapor deposition (PVD) or liquid-phase epitaxy (LPE). Preferably, the method of performing epitaxial growth comprises metal-organic chemical vapor deposition (MOCVD). Then, a platform on the epitaxial lamination is formed by etching process and the surface 21A of the first conductive type semiconductor region 20 is exposed.

By changing the physical composition and chemical composition of one or more layers in the epitaxial lamination (such as the first conductive type semiconductor region 20, the second conductive type semiconductor region 30 and the active region 40), the light-emitting wavelengths of the semiconductor device 1 and semiconductor device 2 are adjusted. The materials of the epitaxial lamination comprise III-V group semiconductor materials, such as AlInGaP materials, InGaN series materials, AlGaN series materials or InAlGaN series materials. When the material of the active region 40 comprises AlInGaP materials, red light having a wavelength range between 610 nm and 650 nm or green light having a wavelength range between 530 nm and 570 nm can be emitted. When the material of the active region 40 comprises InGaN series materials, blue light having a wavelength range between 400 nm and 490 nm, cyan light having a wavelength range between 490 nm and 530 nm or green light having a wavelength range between 530 nm and 570 nm can be emitted. When the material of the active region 40 comprises AlGaN series materials or InAlGaN series materials, ultraviolet light having a wavelength range between 400 nm and 250 nm can be emitted.

The first conductive type semiconductor region 20 and the second conductive type semiconductor region 30 can be a cladding layer. The first conductive type semiconductor region 20 and the second conductive type semiconductor region 30 have different conductive types, electrical properties, or polarities. Alternatively, the first conductive type semiconductor region 20 and the second conductive type semiconductor region 30 provide electrons or electron holes according to the doping element. For example, the first conductive type semiconductor region 20 is an n-type semiconductor, and the second conductive type semiconductor region 30 is a p-type semiconductor. The active region 40 is formed between the first conductive type semiconductor region 20 and the second conductive type semiconductor region 30. Driven by a current, electrons and electron holes recombine in the active region 40, and electrical energy is converted into light energy to emit a light. The active region 40 may be a single heterostructure (SH), a double heterostructure (DH), a double-side double heterostructure (DDH) or a multi-quantum well (MQW). The material of the active region 40 may be an intrinsic, p-type or n-type semiconductor. The first conductive type semiconductor region 20, the second conductive type semiconductor region 30 or the active region 40 may be a single-layer structure or a multilayer structure.

In the present disclosure, the buffer structures 200 of the semiconductor device 1 and the semiconductor device 2 in accordance with any one of the embodiments are located between the substrate 10 and the first conductive type semiconductor region 20. The disposal of the buffer structure 200 is to reduce defects and to enhance the quality of epitaxial layer grown on the buffer structure 200. The buffer structure 200 comprises a single layer or a multilayer (not shown in the drawings). In an embodiment, the buffer structure 200 comprises $Al_iGa_{1-i}N$, wherein 0≤i≤1. In an embodiment, the material of the buffer structure 200 comprises GaN. In another embodiment, the material of the buffer structure 200 comprises AlN. The method of forming a buffer structure may be metal-organic chemical vapor deposition (MOCVD), molecular beam epitaxy (MBE), hydride vapor phase epitaxy (HVPE) or physical vapor deposition (PVD). Physical vapor deposition (PVD) comprises sputtering coating or electron beam evaporation. When the buffer structure 200 comprises a layer (not shown in the drawings) of a multilayer, the layer comprises identical materials or different materials. In an embodiment, the buffer structure comprises two layers, wherein the growth method of the first layer is sputtering coating, and the growth method of the second layer is metal-organic chemical vapor deposition (MOCVD). In an embodiment, the buffer structure additionally comprises a third layer, wherein the growth method of the third layer is metal-organic chemical vapor deposition (MOCVD), and the growth temperature of the second layer is higher or lower than that of the third layer. In an embodiment, the first layer, the second layer and the third layer comprise an identical material, such as aluminum nitride (AlN). Alternatively, the first layer, the second layer and the third layer comprise different materials, such as the combination of aluminum nitride (AlN), gallium nitride (GaN) and aluminum gallium nitride (AlGaN). In other embodiments, the buffer structure comprises physical vapor deposition-aluminum nitride (PVD-AlN) and the target material used to form physical vapor deposition-aluminum nitride (PVD-AlN) is composed of aluminum nitride (AlN). Alternatively, aluminum nitride is reactively formed in nitrogen source atmosphere with the target material composed of aluminum.

In an embodiment, the buffer structure 200 may be undoped (namely, unintendedly doped). In another embodiment, the buffer structure 200 comprises a dopant, such as silicon (Si), carbon (C), hydrogen (H), oxygen (O) or the combination thereof, and the concentration of the dopant in the buffer structure 200 is not less than $1 \times 10^{17}/cm^3$. In some embodiments, when the buffer structure 200 comprises a multilayer and comprises a first dopant, the concentration of the first dopant of one layer close to the second semiconductor structure 22 is higher than the concentration of the first dopant of one layer away from the second semiconductor structure 22. For example, the concentration of the first dopant of one layer close to the first conductive type semiconductor region 20 is greater than $1 \times 10^{18}/cm^3$, and the concentration of the first dopant of one layer away from the first conductive type semiconductor region 20 is less than $1 \times 10^{17}/cm^3$.

In the present disclosure, the active regions 40 in the semiconductor device 1 and the semiconductor device 2 in accordance with any one of the embodiments comprise well layers (not shown in the drawings) and barrier layers (not shown in the drawings) alternately arranged. Each of the barrier layers has an energy level and each of the well layers has an energy level. In an embodiment, an energy level of one of the barrier layers is not lower than an energy level of one of the well layers and is preferably higher than an energy level of one of the well layers. Preferably, energy levels of each of the barrier layers are not lower than energy levels of each of the well layers and are preferably higher than energy levels of each of the well layers. The well layers comprise III-V group semiconductor materials. In the present embodiment, the well layers comprise $In_fGa_{1-f}N$, wherein 0≤f≤1. The barrier layer comprises $Al_hGa_{1-h}N$, wherein 0≤h≤1, in an embodiment, 0≤h≤0.6. In an embodiment, the barrier layer comprises a single layer or a multilayer, and the content of aluminum in the barrier layer gradually decreases toward the direction away from the first conductive type semiconductor region 20. In an embodiment, a portion or all of the barrier layer comprise a dopant, and the concentration of the dopant in the barrier layer gradually increases toward the direction away from the first conductive type semiconductor region 20. The thicknesses of each of the barrier layers are greater than a thickness of one of the well layers. Preferably, the thicknesses of each of the barrier layers are greater than the thicknesses of each of the well layers. Preferably, the thicknesses of each of the barrier layers are not greater than 15 nm and not less than 3 nm. The thicknesses of each of the well layers are not greater than 5 nm and not less than 1 nm. A single well layer and a single barrier layer adjacent thereof are considered as one pair. The number of pairs of the well layers and the barrier layers is not less than 4 and is preferably not greater than 15. In other embodiments, an intermediate layer (not shown in the drawings) may be further disposed between the barrier layer and the well layer, and the material of the intermediate layer comprises GaN or AlGaN.

In the present disclosure, the second conductive type semiconductor regions 30 in the semiconductor device 1 and the semiconductor device 2 in accordance with any one of the embodiments comprise a third dopant, and the third dopant comprises magnesium (Mg).

In the present disclosure, the second conductive type semiconductor regions 30 of the semiconductor device 1 and the semiconductor device 2 in accordance with any one of the embodiments comprise a seventh semiconductor structure 31. The seventh semiconductor structure 31 comprises III-V group semiconductor materials, such as $Al_rGa_{1-r}N$, wherein 0≤r≤1. In an embodiment, the seventh semiconductor structure 31 comprises an electron barrier layer (not shown in the drawings) and a carrier injection layer (not shown in the drawings) located between the electron barrier layer and the active region 40. In an embodiment, the material of the carrier injection layer comprises GaN, InGaN, AlGaN or InAlGaN. The material of the electron barrier layer comprises AlGaN, and the energy level of the electron barrier layer is higher than an energy level of one of the barrier layers of the active region 40 and/or higher than the energy level of the carrier injection layer. The thickness of the seventh semiconductor structure 31 is greater than 20 nm and preferably not greater than 300 nm. In some embodiments, the doping concentration of the third dopant in the seventh semiconductor structure 31 is greater than $1 \times 10^{17}/cm^3$ and/or not greater than $1 \times 10^{21}/cm^3$.

In the present disclosure, the second conductive type semiconductor region 30 of the semiconductor device 1 and the semiconductor device 2 in accordance with any one of the embodiments further comprises a contact layer 32. The second electrode 60 is in direct contact with the contact layer 32. In some embodiments, the doping concentration of the third dopant in the contact layer 32 is not less than $1 \times 10^{18}/cm^3$, preferably not less than $1 \times 10^{19}/cm^3$, and more preferably between $1 \times 10^{19}/cm^3$ and $1 \times 10^{21}/cm^3$ (including end values). In an embodiment, the doping concentration of the third dopant in the contact layer 32 is greater than, equal to or less than the doping concentration of the third dopant in the seventh semiconductor structure 31. The material of the contact layer 32 is selectively adjusted depending on the materials or wavelength emitted of the active region 40. The material of the contact layer 32 comprises III-V group semiconductor materials, such as $In_gAl_eGa_{1-g-e}N$, wherein $0 \le e \le 1$, $0 \le g \le 1$. In an embodiment, when the material of the active region 40 comprises InGaN series materials, blue light of a wavelength between 400 nm and 490 nm, cyan light of a wavelength between 490 nm and 530 nm or green light of a wavelength between 530 nm and 570 nm may be emitted, and the contact layer comprises GaN, InGaN or InAlGaN. When the material of the active region 40 comprises AlGaN series materials or InAlGaN series materials, ultraviolet light of a wavelength between 400 nm and 250 nm may be emitted, and the contact layer comprises AlGaN or InAlGaN. The thickness of the contact layer 32 is less than the thickness of the second conductive type semiconductor region 30. The thickness of the contact layer is not greater than 15 nm and preferably not less than 5 Å.

In the present disclosure, the seventh semiconductor structures 31 of the semiconductor device 1 and the semiconductor device 2 in accordance with any one of the embodiments further comprise an aluminum-containing layer (not shown in the drawings). In some embodiments, the aluminum-containing layer is located between the electron barrier layer and the contact layer 32. In other embodiments, the aluminum-containing layer is located between the electron barrier layer and the active region. In addition, in a specific embodiment, an energy level of the aluminum-containing layer is higher than an energy level of one of the barrier layers of the active region 40 and/or higher than an energy level of the electron barrier layer. In an embodiment, an electron blocking region comprises a first electron blocking layer of a single layer. The material of the first electron blocking layer comprises $In_mAl_qGa_{1-m-q}N$, wherein $0 \le m \le 1$, $0 \le q \le 1$, and preferably, $0 \le m \le 0.005$, $0 < q \le 0.5$. In another embodiment, the electron blocking region comprises first electron blocking layers (not shown in the drawings) and second barrier layers (not shown in the drawings) alternately arranged, wherein the energy levels of each of the first electron blocking layers are higher than the energy levels of the second barrier layers. The second barrier layers comprise $In_lAl_kGa_{1-l-k}N$, wherein $0 \le l \le 1$, $0 \le k \le 1$, and preferably, $k \le q$. A first electron blocking layer and a second barrier layer adjacent thereof are considered as one pair. In one embodiment, the number of pairs of the first electron blocking layers and the second barrier layers are between 3 and 10 (including end values). In the present embodiment, the materials of the first electron blocking layers are substantially identical. The materials of the second barrier layers are identical. In another embodiment, the first electron blocking layers comprise different materials. The first electron blocking layers and the second barrier layers alternately arranged may increase the luminous efficiency of the semiconductor device.

In the present disclosure, the first electrodes 50 and the second electrodes 60 of the semiconductor device 1 and the semiconductor device 2 in accordance with any one of the embodiments are used to connect with an external power source and to conduct the current between the first electrode 50 and the second electrode 60. The materials of the first electrode 50 and the second electrode 60 comprise a transparent conductive material or a metallic material. The transparent conductive material comprises transparent conductive oxide, comprising indium tin oxide (ITO), indium oxide (InO), tin oxide (SnO), cadmium tin oxide (CTO), antimony tin oxide (ATO), aluminum zinc oxide (AZO), zinc tin oxide ($Zn_2SnO_4$, ZTO), gallium doped zinc oxide (GZO), tungsten doped indium oxide (IWO), zinc oxide (ZnO) or indium zinc oxide (IZO). The metallic material comprises chromium (Cr), gold (Au), aluminum (Al), copper (Cu), silver (Ag), tin (Sn), nickel (Ni), rhodium (Rh), platinum (Pt), germanium gold nickel (GeAuNi), titanium (Ti), beryllium gold (BeAu), germanium gold (GeAu), or zinc gold (ZnAu). In some embodiments, the first electrode 50 and/or the second electrode 60 are a single layer or a structure comprising a multilayer, for example, comprising Ti/Au layer, Ti/Al layer, Ti/Pt/Au layer, Cr/Au layer, Cr/Pt/Au layer, Ni/Au layer, Ni/Pt/Au layer, Ti/Al/Ti/Au layer, Cr/Ti/Al/Au layer, Cr/Al/Ti/Au layer, Cr/Al/Ti/Pt layer, Cr/Al/Cr/Ni/Au layer, or the combination thereof.

In an embodiment, the first electrode 50 and the second electrode 60 are located on two opposite sides of the substrate 10, respectively. In the present embodiment, the substrate 10 comprises a conductive material.

If the semiconductor device 1 and the semiconductor device 2 in accordance with any one of the embodiments comprise a light-emitting diode or a laser diode, the peak wavelengths of light emitted from the semiconductor device 1 and the semiconductor device 2 are in the visible spectrum or in the invisible spectrum, and preferably, in the green light spectrum, the blue light spectrum or the ultraviolet light spectrum. Preferably, the range of the peak wavelengths is between 250 nm and 570 nm (including end values), and preferably, between 350 nm and 480 nm (including end values).

In another embodiment of the present disclosure, the devices or the structures in the abovementioned embodiments may be changed or combined with each other.

It is noted that each of the embodiments listed in the present application is merely used to describe the present application, not limiting the scope of the present application. It will be apparent to any one that obvious modifications or variations can be made to the devices in accordance with the present disclosure without departing from the spirit and scope of the present application. Identical or similar components in different embodiments or the components having identical reference numerals in different embodiments have identical physical properties or chemical properties. In addition, under suitable circumstances, the above-mentioned embodiments in the present application may be combined or replaced with each other, not limiting to the specific embodiments described above. In an embodiment, the connecting relationship of the specific component and other component described in detail may also be applied into other embodiments, falling within the scope of the following claims and their equivalents of the present application.

What is claimed is:

1. A semiconductor device, comprising:
   a first conductive type semiconductor region comprising a first semiconductor structure, wherein the first semiconductor structure comprises one or more pairs of stack, the one or more pairs of stack respectively comprise a first layer and a second layer, the first layer comprises $Al_xGa_{1-x}N$, the second layer comprises $Al_yGa_{1-y}N$, wherein $0 \le x \le 1$, $0 \le y \le 1$, $x \le y$; wherein one of the one or more pairs of stack comprises an interface region located between the first layer and the second layer adjacent to the first layer;
   a second conductive type semiconductor region located on the first conductive type semiconductor region; and
   an active region located between the first conductive type semiconductor region and the second conductive type semiconductor region;
   wherein the first semiconductor structure comprises a first dopant having a first doping concentration with a peak value at the interface region.

2. The semiconductor device according to claim 1, wherein $0 \leq x \leq 0.1$.

3. The semiconductor device according to claim 1, wherein $0 \leq y \leq 0.1$.

4. The semiconductor device according to claim 1, wherein the first layer or the second layer has a thickness between 5 nm and 100 nm (including end values).

5. The semiconductor device according to claim 1, wherein the first layer or the second layer has a thickness between 20 nm and 70 nm (including end values).

6. The semiconductor device according to claim 1, wherein the first doping concentration in the first layer gradually changes toward the interface region from a side away from the interface region, the first doping concentration in the second layer gradually changes toward the interface region from a side away from the interface region.

7. The semiconductor device according to claim 1, wherein the first doping concentration of the first dopant of the first semiconductor structure is between $1 \times 10^{19}/cm^3$ and $2 \times 10^{19}/cm^3$.

8. The semiconductor device according to claim 1, wherein the first doping concentration has a minimum value, and a ratio of the peak value to the minimum value is not less than 1.1.

9. The semiconductor device according to claim 8, wherein the ratio of the peak value to the minimum value is not greater than 10.

10. The semiconductor device according to claim 9, wherein the ratio of the peak value to the minimum value is between 1.2 and 5 (including end values).

11. The semiconductor device according to claim 1, further comprising an electrode located on the first conductive type semiconductor region, wherein the first semiconductor structure of the first conductive type semiconductor region has a surface not overlapped with the active region, and the electrode is in direct contact with the surface of the first semiconductor structure.

12. The semiconductor device according to claim 1, wherein the first conductive type semiconductor region further comprises a second semiconductor structure located on another side of the first semiconductor structure opposite to the active region, the first semiconductor structure and the second semiconductor structure respectively comprise a second dopant, the second dopant of the first semiconductor structure has a third doping concentration, the second dopant of the second semiconductor structure has a fourth doping concentration, and the fourth doping concentration is higher than the third doping concentration.

13. The semiconductor device according to claim 12, wherein the second dopant comprises carbon (C).

14. The semiconductor device according to claim 12, wherein the second semiconductor structure comprises the first dopant, the first dopant of the second semiconductor structure has a second doping concentration, the second doping concentration is not greater than the first doping concentration.

15. The semiconductor device according to claim 14, wherein the second doping concentration is not greater than $3 \times 10^{19}/cm^3$.

16. The semiconductor device according to claim 12, wherein the fourth doping concentration is greater than $1 \times 10^{17}/cm^3$.

17. The semiconductor device according to claim 12, wherein the second semiconductor structure comprises $Al_{z1}In_{z2}Ga_{1-z1-z2}N$, wherein $0 \leq z2 \leq z1 \leq 1$ and $z1 \geq y$.

18. The semiconductor device according to claim 12, wherein the material composition of aluminum of the second semiconductor structure is higher than that of the first semiconductor structure.

* * * * *